(12) United States Patent
Yamamoto et al.

(10) Patent No.: US 6,390,854 B2
(45) Date of Patent: May 21, 2002

(54) RESIN SHIELD CIRCUIT DEVICE

(75) Inventors: Naoki Yamamoto, Chita-gun; Hitoshi Irie, Nagoya, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/903,653

(22) Filed: Jul. 13, 2001

(30) Foreign Application Priority Data

Jul. 13, 2000 (JP) .......................................... 2000-213086

(51) Int. Cl.⁷ .............................................. H01R 13/66
(52) U.S. Cl. .......................................... 439/620; 439/936
(58) Field of Search ................... 439/936, 276, 439/620

(56) References Cited

U.S. PATENT DOCUMENTS 5,090,919 A * 2/1992 Tsuji ........................... 439/519
6,186,820 B1 * 2/2002 Daoud ........................ 439/404

FOREIGN PATENT DOCUMENTS

JP  2-114552  4/1990

OTHER PUBLICATIONS

Journal of Nippondenso Technical Disclosure No. 53–158, issued on May 15, 1987.

* cited by examiner

*Primary Examiner*—Tho D. Ta
*Assistant Examiner*—Ann McCamey
(74) *Attorney, Agent, or Firm*—Harness, Dickey & Pierce, PLC

(57) ABSTRACT

In the resin shield circuit device, a resin case is provided with a recess having an opening. Each end of connector terminals is exposed out of the resin case and the other end thereof is embedded into the resin case. Base portions of wiring metal pieces are embedded into the resin case and connected in circuit with the other ends of the connector terminals. Connecting portions of the wiring metal pieces protrude into the recess. Lead terminals of circuit elements are connected and fixed to the connecting portions, respectively. A resin shield portion filled in the recess covers the circuit elements and the connecting portions of the wiring metal pieces in such a manner that only a flat surface of the resin shield portion is exposed out of the opening of the recess to outside.

10 Claims, 2 Drawing Sheets

RESIN SHIELD CIRCUIT DEVICE

CROSS REFERENCE TO RELATED APPLICATION

This application is based upon and claims the benefit of priority of Japanese Patent Application No. 2000-213086 filed on Jul. 13, 2000, the content of which is incorporated herein by reference.

BACKGROUND OF THE INVENTION

1. Field of the Invention

The present invention relates to a resin shield circuit device.

2. Description of Related Art

Conventionally, a resin shield circuit device is formed by accommodating a circuit board (a printed wiring board), on which circuit elements are mounted and which has connecting terminals leading to outside, into a recess of a resin case and, after pouring liquid resin from an opening of the recess into inside of the recess by potting, hardening the liquid resin. This is hereinafter called a potting type resin shield circuit device.

Further, a conventional resin mold semiconductor device is formed by bonding semiconductor chips on metal bases stamped together with lead frames, connecting respective wiring metal regions of the semiconductor chips to the respective lead frames by wire bonding or in use of balls or pumps, then, shielding the connecting portions and the semiconductor chips by resin molding and, finally, cutting off junctions connecting the respective lead frames. This is hereinafter called molding type resin shield circuit device.

Furthermore, a conventional resin connector has a connecting terminal protruding into a recess of a connector body for coupling with an opponent plug. A base of the connecting terminal is fixed to the connector body by insert molding. Moreover, a resin shield circuit device, in which the resin connecter mentioned above and the potting type resin shield circuit device are integrated into one body, is also known.

The potting type resin shield circuit device has good characteristics such as exclusion of moisture and improved reliability since the resin filled in the recess of the resin case is exposed to outside only from the opening of the recess, but has problems to solve as described below.

When many of the circuit elements (discrete circuit elements) having lead terminals and many wiring metal pieces are mounted on the printed wiring board, it becomes necessary to cut in advance respective lengths of the lead terminals and connecting portions of the wiring metal pieces to respective predetermined values before inserting the lead terminals and the wiring metal pieces into apertures of the printed wiring board for soldering. Further, it becomes necessary to form wiring patterns on the printed wiring board. Accordingly, manufacturing processes of the circuit device are complicated and much more material is used.

Further, when the circuit element rises for a certain distance out of a flat surface of the printed wiring board, it is necessary that the circuit device has thickness corresponding to at least a sum of length of each of the lead terminals and height of the circuit element. As a result, a more amount of resin for shielding and a larger body of the circuit device are required. Furthermore, in a case of the circuit element having lead terminals that extend in opposite directions from the ends thereof, the lead terminal on a side opposite to the printed wiring board is required to bend by 180 degrees angle. When the circuit element lies on the printed wiring board, the lead terminals are required to bend at approximately right angles so that the manufacturing process is complicated.

Moreover, outside connecting terminals, which connect the wiring patterns of the printed wiring board to outside, protrude out of a resin shield portion. Since heat stress occurs between the outside connecting terminals and the resin shield portion whose heat expansion rates are different, a crack or a small gap, through which moisture is entered into inside of the circuit device, is likely formed at a boundary between contacts of the outside connecting terminals and the resin shield portion, during a long time when the circuit device is used.

SUMMARY OF THE INVENTION

An object of the invention is to provide a compact and reliable resin shield circuit device that is manufactured at simpler manufacturing processes and with less amount of material to be used.

To achieve the above objects, in the resin shield circuit device, a resin case is provided with a recess having an opening. Each end of connector terminals is exposed out of the resin case and the other end thereof is embedded into and fixed to the resin case. Base portions of wiring metal pieces are embedded into and fixed to the resin case and connected in circuit with the other ends of the connector terminals. Connecting portions of the wiring metal pieces protrude into the recess. Respective lead terminals of circuit elements are connected and fixed to the respective connecting portions. A resin shield portion filled in the recess covers the circuit elements and the connecting portions of the wiring metal pieces in such a manner that only a flat surface of the resin shield portion is exposed out of the opening of the recess to outside.

According to the resin shield circuit device mentioned above, the resin shield portion is formed generally by potting process and has the flat surface exposed only out of the opening of the recess to outside, resulting in good characteristics of moisture exclusion and reliability, similarly to the conventional potting type resin shield circuit device.

Further, each of the circuit elements is directly mounted on and fixed to each of the wiring metal pieces without using the conventional printed wiring board to be housed in the recess of the resin case so that a volume of the recess is smaller and the manufacturing processes is simpler. It is not necessary to connect a wiring of the printed wiring board to the wiring metal pieces.

Furthermore, since the wiring metal pieces are formed together with the resin case by insert molding, the manufacturing process is simpler.

When the circuit elements are mounted on the printed wiring board, it is very common that main bodies of the circuit elements are positioned at certain distances from a surface of the printed wiring to secure faster flow of potting resin and not to make voids of resin. Accordingly, the amount of resin for shielding of the conventional device is larger, compared with the resin amount of the resin shield portion of the circuit device, in which the lead terminals of the circuit elements are directly fixed to the wiring metal pieces so that idling space in the recess is reduced.

It is preferable that all of the lead terminals are connected inside the resin shield portion to the wiring metal pieces and not exposed out of the flat surface of the resin shield portion. Since the lead terminals of the circuit elements are connected in circuit to outside only through the wiring metal pieces and the connector terminals, there is no risk that moisture enters through gaps between the lead terminals and the resin shield portion that is formed by relatively low density resin, as is the conventional potting type resin shield circuit device. Accordingly, reliability of excluding moisture and hydrolysis due to the moisture is remarkably improved.

Further, preferably, the circuit elements and the wiring metal pieces are arranged not to overlap each other in a direction perpendicular to the flat surface of the resin shield portion. with this arrangement, mounting of the circuit elements on the wiring metal pieces in the recess becomes very easy since the circuit elements can be inserted into the recess and soldered to the wiring metal pieces in a depth direction of the recess without interfering with each other.

Further, it is preferable that the connecting portions extend in the recess in parallel to the flat surface of the resin shield portion. More preferably, the connecting portions extend in the recess on a single hypothetical surface parallel to the flat surface of the resin shield portion. With these constructions, manufacturing processes including setting the wiring metal pieces in an insert molding die and mounting the circuit elements on the wiring metal pieces become simpler and easier.

Furthermore, it is preferable to have a shelf formed integrally with the resin case in a shape of protruding inward out of an inner surface of the recess so that any of the main bodies or lead terminals of the circuit elements is easily mounted on the shelf at a given distance from the flat surface of the resin shield portion.

To secure an adequate positioning of the main body or lead terminal of the circuit element when the circuit element is mounted on the wiring metal piece, it is preferable that the shelf or the connecting portion of the wiring metal piece is provided with a depression.

BRIEF DESCRIPTION OF THE DRAWING

Other features and advantages of the present invention will be appreciated, as well as methods of operation and the function of the related parts, from a study of the following detailed description, the appended claims, and the drawings, all of which form a part of this application. In the drawings:

DETAILED DESCRIPTION OF THE PREFERRED EMBODIMENTS

Figure 1:
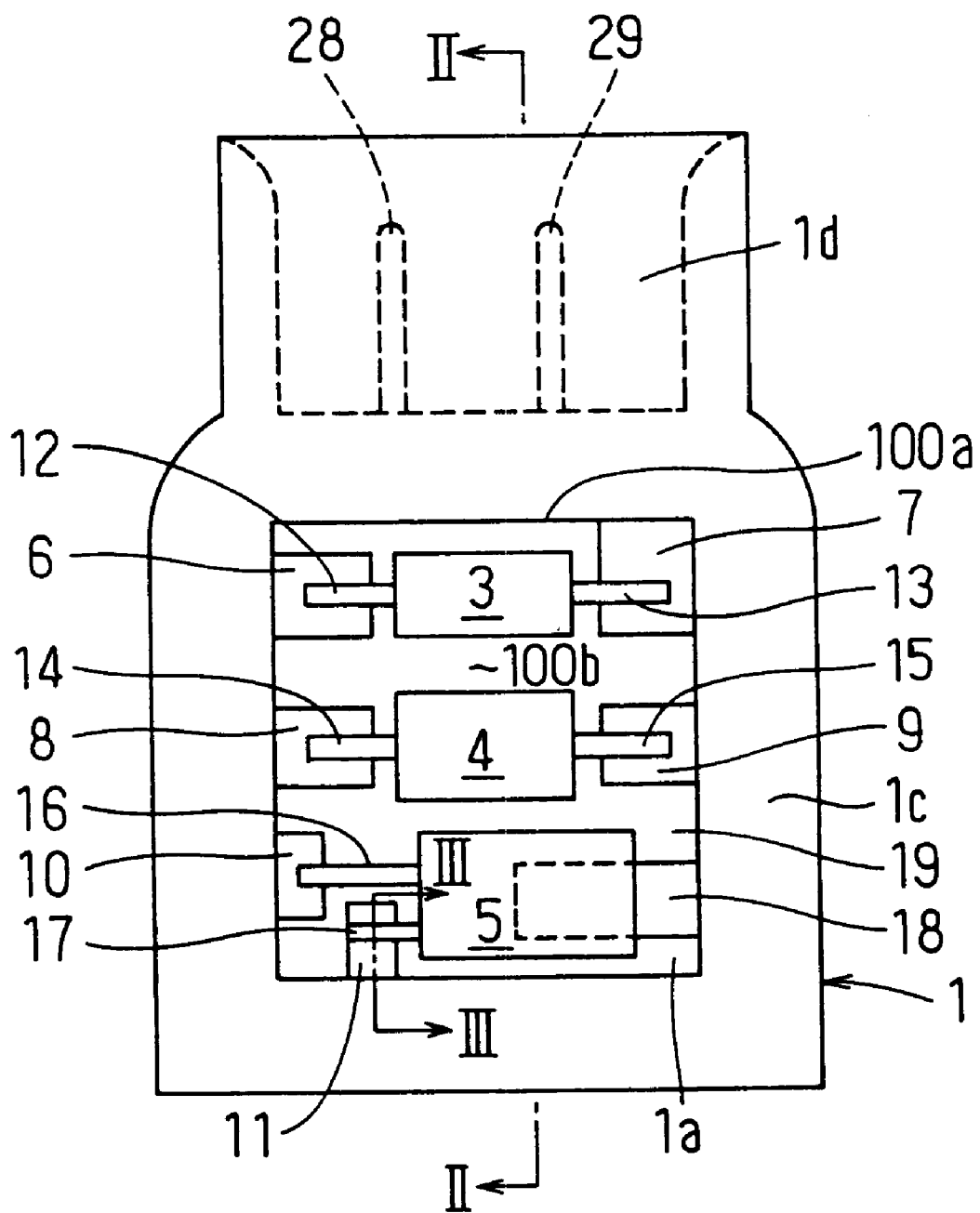
FIG. 1 is a plan view of a circuit device according to a preferred embodiment (a resin shield portion omitted)
Figure 2:
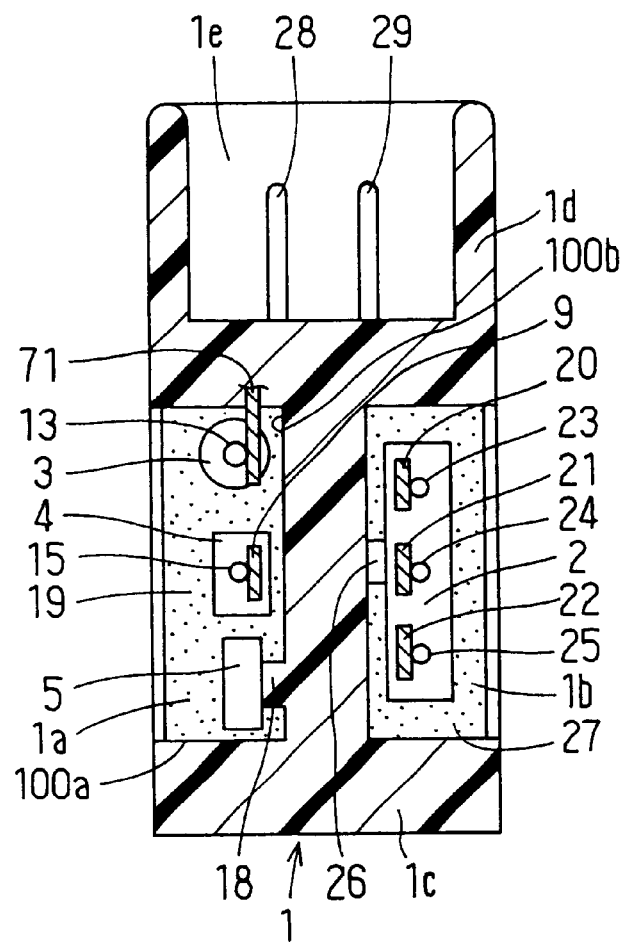
FIG. 2 is a cross sectional view taken along a line H—H of FIG. 1.
Figure 3:
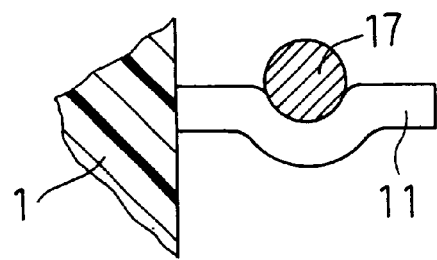
FIG. 3 is a partly enlarged cross sectional view taken along a line III–III of FIG. 1.

A potting type resin shield circuit device according to a preferred embodiment of the present invention is described with reference with FIGS. 1 to 3.

The potting type resin shield circuit device is a voltage regulator with a connector. A resin circuit case 1 has a main body 1c and a connector body 1d formed integrally with the main body 1c. The main body 1c is provided with first and second recesses 1a and 1b which are opened in opposite directions and in which circuit elements are accommodated.

An IC module 2 is one of the circuit elements in which a regulator IC chip (not shown) is housed in a resin molding package. Circuit elements 3 to 5 are outside mounting circuit elements for the IC module 2. The IC module 2 and the circuit 3 to 5 constitute the voltage control regulator installed in a known alternator for vehicles.

Wiring metal pieces 6 to 11 are fixed to the circuit case 1 and protrude out of a side wall 100a surrounding the first recess 1a toward an inside of the first recess 1a. Each of the wiring metal pieces 6 to 11 is composed of a base portion embedded into the circuit case 1 (FIG. 2 shows only a part of the base 71 of the wiring metal piece 7) and a lead terminal connecting portion protruding into the inside of the first recess 1a in parallel to a bottom surface 100b (or an opening surface thereof) of the first recess 1a at a mutually identical interval from the bottom surface 100b. Lead terminals 12 and 13 of the circuit element 3, lead terminals 14 and 15 of the circuit element 4 and lead terminals 16 and 17 of the circuit element 5 are separately mounted on and soldered to the respective lead terminal connecting portions of the wiring metal pieces 6 to 11.

A shelf 18 is formed integrally with the circuit case 1 and rises out of the bottom 100b to constitute a resin pedestal. A body (other than the lead terminals 16 and 17) of the circuit element 5 is mounted on the shelf 18. The shelf 18 is not always necessary for mounting the lead terminals 16 and 17 on the wiring metal pieces 10 and 11 and whether the shelf 18 is provided or not depends on a shape of the circuit element 5. Further, a shelf or pedestal similar to the shelf 18 may be provided for mounting a body of the other circuit element 3 or 4. A resin shield portion 19 is formed in such a manner that epoxy resin is poured into the first recess 1a by potting after the lead terminals 16 to 17 are mounted on the wiring metal pieces 6 to 11, respectively.

Wiring metal pieces 20 to 22 are fixed to the circuit case 1 and protrude out of a side wall 200a surrounding the second recess 1b toward an inside of the second recess 1b. Each of the wiring metal pieces 20 to 22 is composed of a base portion embedded into the circuit case 1 and a lead terminal connecting portion protruding into the inside of the second recess lab in parallel to a bottom surface 200b of the second recess 1b (or an opening surface thereof) at a mutually identical interval from the bottom surface 200b. Lead terminals 23 to 25 of the IC module 2 are separately mounted on and soldered to the respective lead terminal connecting portions of the wiring metal pieces 20 to 22.

A shelf 26 is formed integrally with the circuit case 1 and rises out of the bottom 200b to constitute a resin pedestal. A body (other than the lead terminals 23 to 25) of the IC module 2 is mounted on the shelf 26. A resin shield portion 27 is formed in such a manner that epoxy resin is poured into the second recess 1b by potting.

Connector terminals 28 and 29 protrude into a connector recess 1e provided in the connector body 1d. The connector terminals 28 and 29 are inserted into holes of a plug (not shown) that is detachably fitted to the recess 1e and connected electrically to female terminals provided in the holes of the plug. The connector terminals 28 and 29 are connected in circuit with the wiring metal pieces 12 to 17 inside the circuit case.

A manufacturing method of the resin shield circuit device according to the preferred embodiment is described below.

The circuit case 1 having the wiring metal pieces 6 to 11, and 20 to 22, the connector terminals 28 and 28 is formed by resin insert molding. Then, the circuit elements 3 to 5 are inserted into the first recess 1a from the opening thereof to position at given places in the first recess 1a and the read terminals 12 to 17 are soldered to the wiring metal pieces 6 to 11 from a side of the opening of the first recess 1a. Any of the wiring metal pieces 6 to 11 may have a depression for easily mounting or positioning any of the read terminals 12 to 17, as shown in FIG. 3 as an example of the wiring metal piece 11 and the read terminal 17. Further, the shelf 18 may be provided with a depression for easily mounting or positioning any of the bodied or lead terminals of the circuit element 3 to 5.

Further, solder may be put or coated in advance on the respective wiring metal pieces 6 to 11 and be melted after mounting the respective read terminals 12 to 17 thereon. Moreover, to prevent each deformation of the read terminal connecting portions of the wiring metal pieces 6 to 11, the recess 1a may be provided with a shelf (pedestal) rising from the bottom 100b so that each back surface of the read terminal connecting portions of the wiring metal pieces 6 to 11 comes in contact with a top surface of the shelf. After the soldering process, liquid epoxy resin is poured into the recess 1a until the epoxy resin completely covers the circuit elements 3 to 5 and is hardened to form the resin shield portion 19. With respect to the second recess 1b, the IC module 2 is mounted on the wiring metal pieces 20 to 22 under similar manufacturing processes mentioned above.

The embodiment mentioned above has many advantages. The resin shield circuit device has a good characteristic of excluding moisture and a good reliability, since any terminal does not penetrate the resin shield portion 19 or 27 so as to be exposed to outside. Further, since the circuit elements 3 to 5 or the IC module 2 are fixed to wiring metal pieces 6 to 11 or 20 to 22, that are fixed to the circuit case 1 and protrude into the recess 1a or 1b, the conventional printed wiring board, on which the circuit elements 3 to 5 or the IC module 2 are mounted in advance, is not necessary so that the recess 1a or 1b is more compact. Furthermore, as the wiring metal pieces 6 to 11, or 20 to 22 are fixed to the circuit case 1 by well known insert molding process and the resin shield portion 19 or 27 is formed by simple potting process, the manufacturing processes becomes simpler. Moreover, as the circuit elements 3 to 5 or the IC module 2 and the read terminals thereof 12 to 17 or 23 to 25 are arranged not to overlap with each other in a direction of the opening surface of the resin shield portion 19 or 27 so that inserting, mounting and soldering processes of the circuit elements or the IC module are easier and a flow of the epoxy resin is smoother not to form voids.

What is claimed is:

1. A resin shield circuit device comprising:

a resin case being provided with a recess having an opening;

connector terminals whose each end is exposed out of the resin case and whose each another end is embedded into and fixed to the resin case;

a plurality of wiring metal pieces each having a base portion and a connecting portion, the base portion being embedded into and fixed to the resin case and connected in circuit with the another end of the connector terminal inside the resin case and the connecting portion protruding into the recess;

a plurality of circuit elements each having a main body and lead terminals, any of the lead terminals being connected and fixed to any of the connecting portions; and a resin shield portion filled in the recess to cover the main bodies, the lead terminals and the connecting portions, the resin shield portion having a flat surface exposed out of only the opening to outside.

2. A resin shield circuit device according to claim 1, wherein all of the lead terminals are connected inside the resin shield portion to the wiring metal pieces and not exposed out of the flat surface of the resin shield portion.

3. A resin shield circuit device according to claim 1, further comprising:

another recess formed in the resin case, the another recess having another opening that is opened in a direction different from that of the opening of the recess;

a plurality of another wiring metal pieces each having another base portion and another connecting portion, the another base portion being embedded into and fixed to the resin case and connected in circuit with the another end of the connector terminal and the another connecting portion protruding into the another recess;

another circuit element having another main body and another lead terminals, any of the anther lead terminals being connected and fixed to any of the another connecting portions; and another resin shield portion filled in the another recess to cover the another main body and lead terminals and the another connecting portions, the another resin shield portion having another flat surface exposed out of only the another opening to outside.

4. A resin shield circuit device according to claim 1, wherein the resin case is provided with a connector recess, into which the ends of the connector terminals protrude.

5. A resin shield circuit device according to claim 1, wherein the circuit elements and the wiring metal pieces are arranged not to overlap each other in a direction perpendicular to the flat surface of the resin shield portion.

6. A resin shield circuit device according to claim 5, wherein any of the connecting portions is provided with a depression serving to restrict a movement of the lead terminal mounted thereon.

7. A resin shield circuit device according to claim 5, wherein the connecting portions extend in the recess in parallel to the flat surface of the resin shield portion.

8. A resin shield circuit device according to claim 7, wherein the connecting portions extend in the recess on a single hypothetical surf ace parallel to the flat surface of the resin shield portion.

9. A resin shield circuit device according to claim 5, further comprising:

a shelf formed integrally with the resin case in a shape of protruding inward out of an inner surface of the recess so that any of the main bodies and lead terminals of the circuit elements is mounted on the shelf at a given distance from the flat surface of the resin shield portion.

10. A resin shield circuit device according to claim 9, wherein the shelf is provided with a depression serving to restrict a movement of said at least one of the main body and lead terminals of the circuit element that is mounted thereon.

* * * * *